United States Patent [19]

Kim

[11] Patent Number: 5,795,796
[45] Date of Patent: Aug. 18, 1998

[54] METHOD OF FABRICATING METAL LINE STRUCTURE

[75] Inventor: Do Heyoung Kim, Seoul, Rep. of Korea

[73] Assignee: LG Semicon Co., Ltd., Chungcheongok-do, Rep. of Korea

[21] Appl. No.: 634,531

[22] Filed: Apr. 18, 1996

[30] Foreign Application Priority Data

Dec. 26, 1995 [JP] Japan ................... 1995/56308

[51] Int. Cl.$^6$ ................................. H01L 21/29
[52] U.S. Cl. ............... 437/189; 437/190; 437/192; 437/195; 437/247
[58] Field of Search ................. 437/189, 190, 437/192, 195, 247, 194

[56] References Cited

U.S. PATENT DOCUMENTS

| | | | |
|---|---|---|---|
| 5,447,599 | 9/1995 | Li et al. | 437/192 |
| 5,470,789 | 11/1995 | Misawa | 437/192 |
| 5,518,936 | 5/1996 | Yamamoto et al. | 437/192 |
| 5,529,954 | 6/1996 | Iijima et al | 437/192 |
| 5,547,901 | 8/1996 | Kim et al. | 437/190 |

OTHER PUBLICATIONS

S. Wolf, "Silicon Processing for the VLSI Era, vol. 2", Lattice Press, p. 132, 1990.
Olowaolafe, J.O. et al., "Effects of oxygen in TiN$_x$ on the diffusion of Cu in Cu/TiN/Al and Cu/TiN$_x$/Si structures", Appl. Phys. Lett 58(5): 469–471 (1991).
Kobeda, E. et al., "Diffusion barrier properties on TiN films for submicron silicon bipolar technologies", J. Appl. Phys. 72(7) 2743–2748 (1992).
Cho, James S.H. et al., "Reliability of CVD Cu Buried Interconnections", IEDM (93): 265–268. (1993).

*Primary Examiner*—John Niebling
*Assistant Examiner*—Thomas G. Bilodeau
*Attorney, Agent, or Firm*—Morgan, Lewis and Bockius LLP

[57] ABSTRACT

A method of fabricating a metal line includes the steps of preparing a semiconductor substrate, depositing a first metal on the semiconductor substrate, heat-treating the first metal to form a first metal nitride layer, depositing a second metal on the first metal nitride layer, heat treating the second metal, depositing a third metal on the second metal, and heat treating both the third metal and the second metal to form a metal insulating layer in which the second and the third metals are mixed. The method of fabricating increases the area occupied by the metal line in a contact hole, decreases contact resistance, and increases the speed of the device.

18 Claims, 5 Drawing Sheets

F I G.6
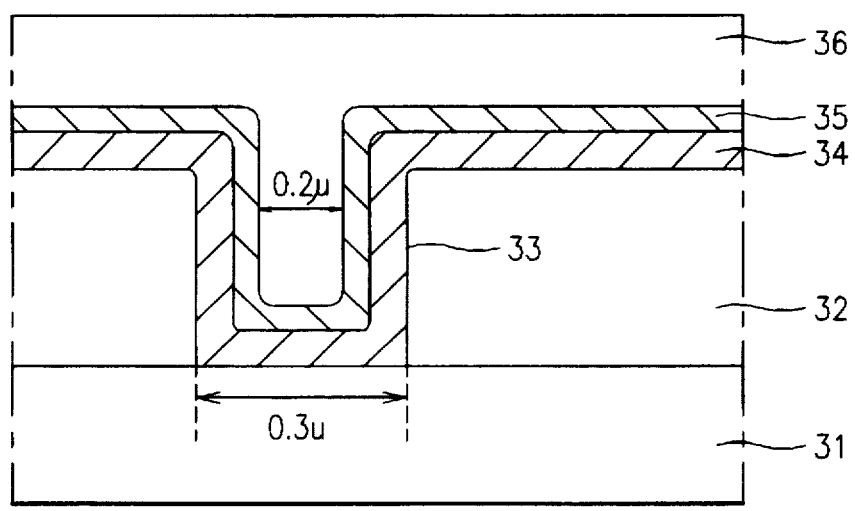

METHOD OF FABRICATING METAL LINE STRUCTURE

BACKGROUND OF INVENTION

1. Field of the Invention

The present invention relates to a metal line, and more particularly, to a metal line structure and a method of fabricating the metal line structure.

2. Discussion of the Related Art

A highly integrated submicron device requires a fast response speed and a dense multilevel interconnection structure. In order to make a highly reliable multilevel interconnection structure, it is very important to use an appropriate electrode.

With new technologies such as bias sputtering and selective chemical vapor deposition, a contact hole or via hole having a high aspect ratio can be filled with aluminum or tungsten for-use in a metal line. Before depositing the aluminum or tungsten, however, a reliable barrier layer or adhesive layer must be formed. In the conventional technology, a Ti layer or TiN layer is widely used as the barrier or adhesive layer. The Ti layer maintains good ohmic contact with silicon. The TiN layer provides excellent thermal stability, improves contact resistance characteristics, and prevents tungsten and Ti from reacting with each other.

A metal line using the TiN as a barrier layer, similar to a conventional structure, will be briefly explained below. FIG. 1 is a cross-sectional view of a stack structure of the metal line. Referring to FIG. 1, the metal line is constructed such that TiN barrier layer 2 is formed on a semiconductor substrate 1, and Cu layer 3 used as a metal line is formed on TiN layer 2.

A method of fabricating a metal line similar to a conventional structure will be explained below. FIGS. 2a and 2b are cross-sectional views showing the sequence of the manufacturing process. As shown in FIG. 2a, semiconductor substrate 1 (or a semiconductor substrate on which an oxide layer as formed) is prepared, and the TiN is deposited on semiconductor substrate 1 using a predetermined Ti target by reactive sputtering in the ambient of $N_2$ or $NH_3$, to form, for instance, TiN layer 2 as the barrier layer. Note that Ta or W may be used instead of Ti. The metal nitride layer may be formed using other methods. For example, $TiN_x$, $TaN_x$ or $WN_x$ can be deposited by sputtering. A heat treatment is carried out for the metal nitride layer in the ambient of $N_2$ or $O_2$. As shown in FIG. 2b, Cu layer 3 is formed on metal nitride layer 2 to complete the metal line.

FIG. 3 is a cross-sectional view showing an example in which the method of fabricating a metal line similar to a conventional structure is applied to a metal line contact hole of a highly integrated device. Referring to FIG. 3, the width of contact hole 13 of a highly integrated device above 256M DRAM is about 0.3 μm. TiN layer 14 is formed on insulating layer 12 including contact hole 13. Here, TiN layer 14 is about 1000 to 1500 Å thick. A metal such as Cu layer 15 is then deposited on the TiN layer and in contact hole 13, to complete the metal line of a highly integrated device (for example, a semiconductor device above 256M DRAM).

The conventional metal line and methods of manufacturing the metal line have the following problems. First, in the conventional metal line structure and the method of fabricating the same, the TiN layer should be formed to a thickness of over 1000Å in order to improve barrier effect. When fabricating a metal line for a highly integrated device above 256M DRAM having a 0.3μ-wide contact hole, if the TiN in the via hole or contact hole is more than 1000 Å thick, then the thickness of the Cu layer occupying the contact hole must be lowered to under 1000 Å. This increases the resistance and deteriorates the characteristics of the device due to the heat generated. The conventional metal line and the method of fabricating the same are thus unsuitable for use in highly integrated devices.

Second, the sputtering method used to form metal nitride in the contact hole, has a low step coverage. This causes the metal nitride layer to form unevenly in the contact hole. The nitride layer becomes thinner while closer to the bottom edge of the contact hole. In order to form a uniform metal line in the contact hole, the metal nitride layer must be formed thick on both the upper side walls of the contact hole. This requires additional rapid thermal nitridation or the use of a collimator (a window through which only ions having a large vertical motion component pass to reach a lower substrate). Due to these limitations resulting from the need to improve the step coverage in the contact hole, the fabricating process yields less than it should. Consequently, the conventional method is not the most suitable process for mass production.

SUMMARY OF THE INVENTION

The present invention has been made in view of the above circumstances and has as an object to provide a metal line structure and a method of fabricating the same suitable for fabricating a highly integrated device, in which barrier effect is improved using a thin metal insulating layer including a metal nitride as a diffusion stop layer.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the metal line structure comprises a semiconductor substrate, a metal nitride layer formed on the semiconductor substrate for preventing metal ions of a metal line from being diffused into the semiconductor substrate, and a metal insulating layer formed on the metal nitride layer.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 6 is a cross-sectional view showing an embodiment in which the method of fabricating the metal line is applied to a metal line of a highly integrated device according to the present invention.

DETAILED DESCRIPTION OF THE PREFERRED EMBODIMENTS

Preferred embodiments of the present invention will be explained below with reference to the accompanying drawings.

In the embodiments of the present invention a metal insulating layer mixed with Cu (Cu-metal-O or Cu-metal-O—N) is used in order to effectively prevent Cu, which is required for the practical use of a Cu line, from being diffused to Si or $SiO_2$.

Referring to "Smithells Metals Reference Book", it is known that Cu-alloys having stable phases includes. Ti-Cu alloy containing above 65% of Ti; Mg—Cu alloy containing above 43% of Mg; and Ta—Cu alloy containing above 30% of Ta.

Referring to an article by Jian Li et. al., entitled "Thermal stability issues in copper barrier based metallization", disclosed in VMIC. p153, 1971, it is reported that Cu—Ti, Cu—Al, Cu—Pd alloys are stable.

Referring to an article by Gerald Kata et. al., entitled "Adhesion of copper films to aluminum oxide using spinel structure interface", disclosed in Thin Solid Films, Vol. 33, p99, 1976, a stable phase is formed in the form of CuO+ $Al_2O_3 \rightarrow CuAl_2O_4$.

The metal line structure of the present invention will be explained below with the reference to the accompanying drawings.

Figure 1:
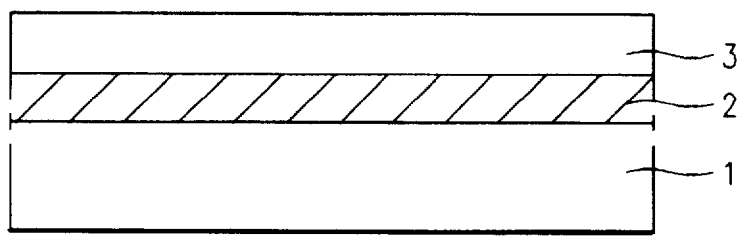
FIG. 1 is a cross-sectional view of a stack structure of a metal line similar to a conventional structure.
Figure 2A:
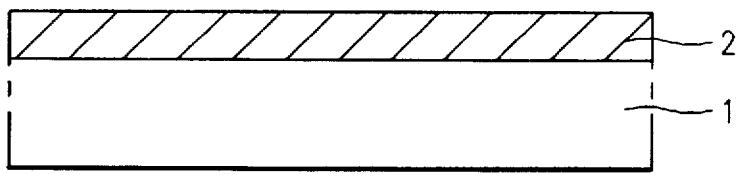
FIGS. 2a and 2b are cross-sectional views showing the sequence of the manufacturing process of the metal line which is similar to a conventional method.
Figure 2B:
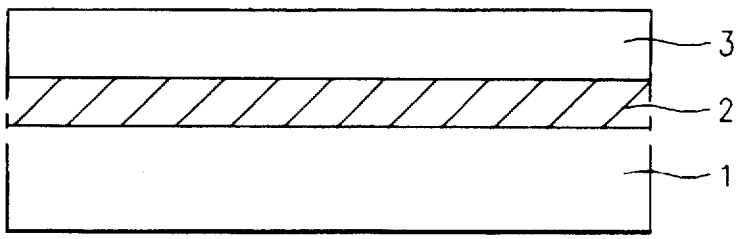
Figure 3:
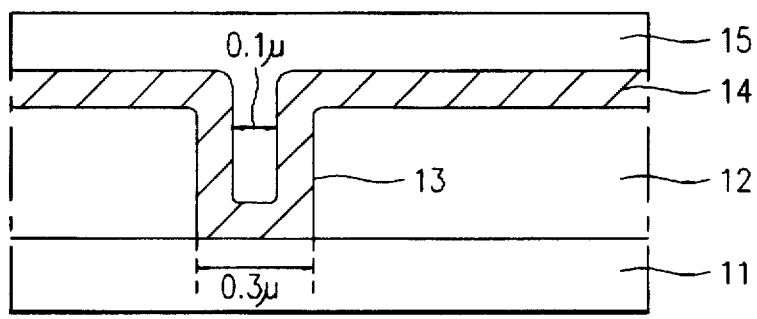
FIG. 3 is a cross-sectional view showing an example in which the method of fabricating the metal line is applied to a metalline of a highly integrated device in a similar way to that of a conventional method.
Figure 4:
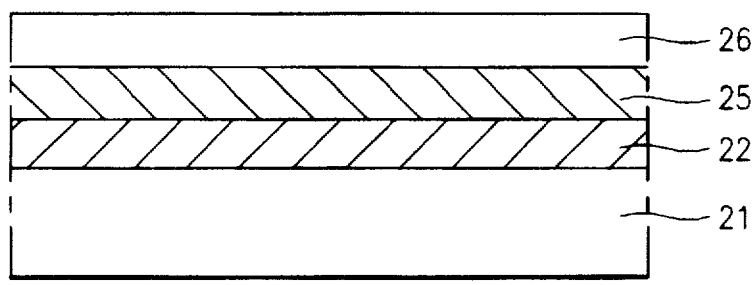
FIG. 4 is a cross-sectional view of a stack structure of a metal line in accordance with the present invention.

FIG. 4 is a cross-sectional view of the metal line structure according to the present invention. Referring to FIG. 4, the metal line structure of the present invention is formed so that first metal nitride layer 22 is formed on semiconductor substrate 21, second metal insulating layer 25 is formed on first metal nitride layer 22, and Cu layer 26 for metal line is formed on second metal insulating layer 25. First metal nitride layer 22 is made either of $TiN_x$, $TaN_x$, $WN_x$, $TiSi_xN_y$ or $TaSi_xN_y$ (0.25<x, y<0.75). Second metal insulating layer 25 contains either $CuM_xO_y$ or $CuM_xO_yN_z$ (0<x<1, 0<y<1, 0≦z<1). The symbol M represents either Al, Ti, Ta, Mg or Zr.

A method of fabricating the metal line according to the present invention will be explained below with reference to the accompanying drawings. FIGS. 5a to 5f are cross-sectional views showing the sequence of the manufacturing process of the metal line in accordance with the present invention.

Figure 5A:
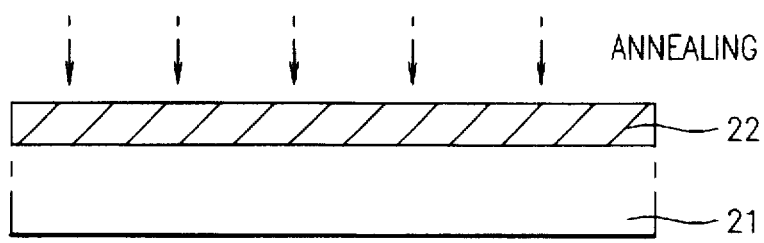
FIGS. 5a to 5f are cross-sectional views showing the sequence of the manufacturing process of the metal line in accordance with the present invention.

As shown in FIG. 5a, semiconductor substrate 21 is prepared, and then Ti, which will be used as a barrier metal, is deposited on semiconductor substrate 21 to the thickness of about 10 to 500 Å using chemical vapor deposition (CVD). Either Ta, W, TaSi or Zr may be used as a barrier metal as well as Ti. Ti may be deposited by sputtering instead of the CVD. Where CVD is used, $Ti[N(C_2H_5)_2]_4$, $Ti[N(CH_3)_2]_4$ or $Ti[N(CH_3)(C_2H_5)]_4$ is used as a reaction gas, and its deposition temperature is about 100° to 500° C., and its deposition gas pressure is about 0.1 to 10 Torr in the reaction chamber. Then, the Ti is annealed at a temperature of about 400° to 1000° C. in the ambient of nitrogen, to form TiN layer 22.

Figure 5B:
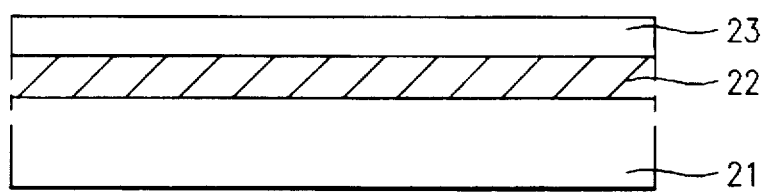

As shown in FIG. 5b, Cu is deposited on TiN layer 22 to the thickness of about 10 to 500 Å using CVD, to form Cu layer 23. Here, Al may be used instead of Cu.

Figure 5C:
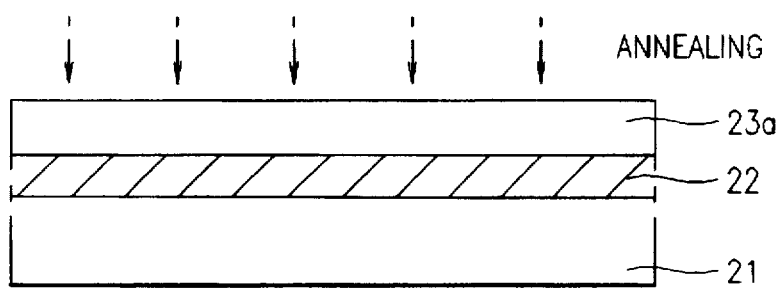

As shown in FIG. 5c, heat treatment (annealing) for Cu layer 23 is carried out at a temperature of about 400° to 1000° C. in the ambient of $O_2$ for a predetermined time, to form CuO layer 23a. CuO layer 23a may also be formed by heat treatment in the atmosphere.

Figure 5D:
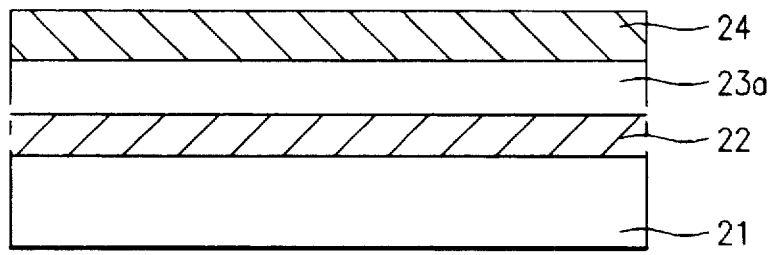

As shown in FIG. 5d, metal or metal nitride 24 (for example, Al or $AlN_x$ (0.25<x<0.75)) is deposited on CuO layer 23a to the thickness of about 10 to 500 Å using CVD. Here, either Ti, Zr, Ta or Mg may be used instead of Al, and either $TiN_x$, $ZrN_x$, $TaN_x$ or $PdN_x$ (0.25<x<0.75) may be used as a metal nitride layer instead of $AlN_x$.

Figure 5E:
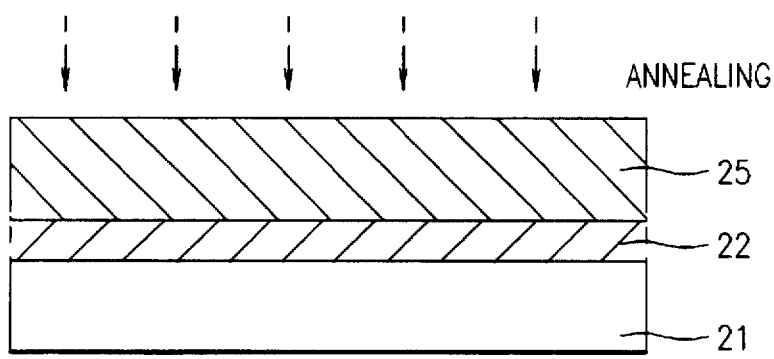

As shown in FIG. 5e, heat treatment (annealing) for metal layer (or metal nitride layer) 24 is carried out at the temperature of about 400° to 1000° C. in the ambient of $O_2$ (or $N_2$, $N_2/O_2$) for a predetermined time, to make CuO layer 23a and metal layer 24 chemically react with each other, thereby forming thin metal insulating layer 25 in which CuO layer 23a and metal layer 24 (or metal nitride layer) are mixed. At this time, metal insulating layer 25 includes either $CuM_xO_y$ or $CuM_xO_yN_z$ (0<x<1, 0<y<1, 0<z≦1). Metal M includes either Al, Ti, Zr, Ta or Mg. By doing so, the overall thickness of TiN layer 22 and metal insulating layer 25 used as a barrier layer are maintained below 1000 Å.

Figure 5F:
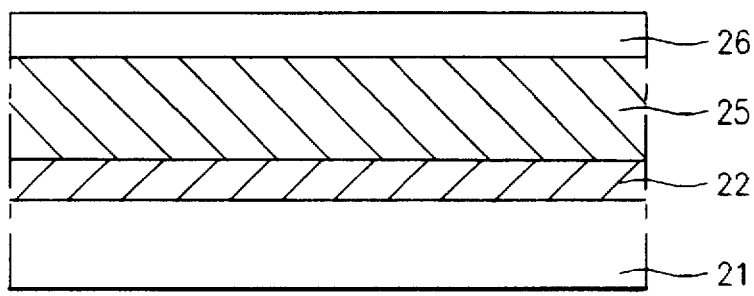

As shown in FIG. 5f, Cu (or Al) is deposited on metal insulating layer 25 using CVD, to form Cu layer 26, completing the metal line process.

Generally, the selective deposition characteristics of copper when used ds a metal line depend on whether a substrate is a conductor or nonconductor. If the substrate is conductive, electrons, which are required for chemical reaction, are easily supplied due to a large amount of free electrons within the conductor.

However, where the substrate is a nonconductor as is the case with a metal oxide (for example, $Al_2O_3$), Cu cannot be expected to grow on the nonconductor, but actually is instead selectively deposited on the nonconductor. That is, where themetal oxide (for example, $Al_2O_3$) is formed to a thickness of about 20 to 30 Å, electrons required for the reaction are supplied from the Al under the metal oxide. The Cu layer for the metal line can therefore be deposited on the metal oxide.

As described above, where the metal oxide is thin, free electrons of the conductor in the metal oxide penetrate into the thin metal oxide to supply electrons required for the chemical reaction at the surface of the metal oxide, thereby allowing the formation of a Cu layer for the metal line.

FIG. 6 is a cross-sectional view showing an embodiment in which the method of fabricating the metal line is applied to a metal line of a highly integrated device according to the present invention. In FIG. 6, contact hole 33 is formed by selectively removing a portion of insulating layer 32 formed on semiconductor substrate 31. A predetermined portion of semiconductor substrate 31 is thus left unexposed. Contact hole 33 has a predetermined width. For example, in the case of 256M DRAM, the hole will be about 0.3 μm.

Metal nitride layer 34 is formed on insulating layer 32 and in contact hole 33 at a thickness of about 10–500 Å. Metal insulating layer 35 is formed on metal nitride layer 34 at a thickness of about 10 to 500 Å. The overall thickness of metal nitride layer 34 and metal insulating layer 35 is thus below about 1000 Å. In other words, the width of contact hole 33 excluding the overall thickness of metal nitride layer 34 and metal insulating layer 35 is about 0.2 μm. A Cu layer (or Al layer) is formed on metal insulating layer 35, filling contact hole 33. This process completes the metal line process.

Fabricating the metal line according to the present invention has the following advantages. First, the metal nitride layer and thin metal insulating layer (for example, Cu—M—O or Cu—M—O—N) used as a barrier layer are formed so that the combined thickness of the metal nitride layer and metal insulating layer is below 1000 Å. By doing so, the area occupied by the metal line in the contact hole is increased, decreasing contact resistance and increasing the operating speed of the device.

Second, although the metal nitride layer and metal insulating layer used as a barrier layer are thin in comparison to the conventional barrier layer, the barrier effect is effectively improved. Accordingly, the present invention is suitable for use in highly integrated devices.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention defined by the claims appended hereto, and their equivalents.

What is claimed is:

1. A method of fabricating a metal line comprising the steps of:

preparing a semiconductor substrate;

depositing a first metal on the semiconductor substrate;

heat-treating the first metal to form a first metal nitride layer;

depositing a second metal on the first metal nitride layer;

heat treating the second metal;

depositing a third metal on the second metal; and heat treating both the third metal and the second metal to form a metal insulating layer in which the second and the third metals are mixed.

2. The method of fabricating the metal line as claimed in claim 1, wherein the first metal is deposited through CVD.

3. The method of fabricating the metal line as claimed in claim 1, wherein the first metal includes either Ti, W, TiSi Or TaSi.

4. The method of fabricating the metal line as claimed in claim 1, wherein the first heat treatment is carried out under the ambient of nitrogen.

5. The method of fabricating the metal line as claimed in claim 1, wherein the first metal nitride layer includes either $TiN_x$, $TaN_x$, $WN_x$, $TiSiN_x$, or $TaSiN_x$ ($0.25<x<0.75$).

6. The method of fabricating the metal line as claimed in claim 1, wherein the first metal nitride layer is formed to a thickness of about 10 to 500 Å.

7. The method of fabricating the metal line as claimed in claim 1, wherein the second metal is deposited through CVD.

8. The method of fabricating the metal line as claimed in claim 1, wherein the second heat treatment is carried out under an ambient of oxygen or air.

9. The method of fabricating the metal line as claimed in claim 1, wherein the third metal is deposited through CVD.

10. The method of fabricating the metal line as claimed in claim 1, wherein the third metal is Al, Ti, Zr, Ta or Pd.

11. The method of fabricating the metal line as claimed in claim 1, wherein the third heat treatment is carried out under the ambient of either $O_2$, $N_2$, $O_2/N_2$, or air.

12. The method of fabricating the metal line as claimed in claim 1, wherein the metal insulating layer mixed with the second and third metal includes Cu, a metal "M", and O.

13. The method of fabricating the metal line as claimed in claim 1, wherein the metal insulating layer mixed with the second and third metal includes Cu, a metal "M", O, and N.

14. The method of fabricating the metal line as claimed in claim 12, wherein the metal "M" is Al, Ti, Zr, Ta or Pd.

15. The method of fabricating the metal line as claimed in claim 13, wherein the metal "M" is Al, Ti, Zr, Ta or Pd.

16. The method of fabricating the metal line as claimed in claim 1, wherein the metal insulating layer mixed with the second and third metal is formed to a thickness of about 10 to 500 Å.

17. The method of fabricating the metal line as claimed in claim 1, wherein the metal insulating layer has conductivity.

18. The method of fabricating the metal line as claimed in claim 1, wherein the metal nitride layer and the metal insulating layer are used as a barrier.

* * * * *